(12) United States Patent
Wozniczka

(10) Patent No.: US 6,301,096 B1
(45) Date of Patent: Oct. 9, 2001

(54) TAMPER-PROOF BALLAST ENCLOSURE

(75) Inventor: George Wozniczka, Chicago, IL (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/531,067

(22) Filed: Mar. 18, 2000

(51) Int. Cl.$^7$ ...................................................... H02B 1/18
(52) U.S. Cl. .......................... 361/674; 361/736; 361/740; 361/747; 174/52.1; 174/61; 220/4.02; 220/4.31
(58) Field of Search .................... 361/600, 601, 361/674, 752, 753, 759; 174/52.1, 53, 54, 66, 61; 220/4.02, 4.21

(56) References Cited

U.S. PATENT DOCUMENTS

| | | | |
|---|---|---|---|
| 3,950,603 | * | 4/1976 | Brefka ................................ 174/52 R |
| 4,840,286 | * | 6/1989 | Heberling et al. .................... 220/4.02 |
| 5,383,098 | * | 1/1995 | Ma et al. .............................. 361/818 |
| 5,691,878 | | 11/1997 | Ahn et al. ............................ 361/674 |
| 5,808,868 | * | 9/1998 | Drekmeier ........................... 361/704 |
| 5,892,659 | * | 4/1999 | Cooper et al. ........................ 361/727 |
| 5,944,210 | * | 8/1999 | Yetter ................................. 220/4.21 |
| 6,111,760 | * | 8/2000 | Nixon ................................. 361/814 |
| 6,137,680 | * | 10/2000 | Kodaira et al. ....................... 361/697 |

* cited by examiner

Primary Examiner—Gerald Tolin
Assistant Examiner—Boris L. Chervinsky

(57) ABSTRACT

An enclosure includes a base unit and a cover unit that snaps into the base unit easily, but is difficult to remove from the base unit without knowledge of the appropriate disassembly technique. The appropriate disassembly technique includes the application of pressure at key regions of the base assembly. The application of pressure at the key regions distorts the base assembly so as to disengage key portions of the cover unit from the base unit. The cover unit includes protrusions having an inclined surface and a flat surface. The inclined surface facilitates manufacturing assembly, and the flat surface encumbers the disassembly of the enclosure. The application of pressure at the key regions distorts the base unit so that the flat surfaces of the protrusions on the cover unit are disengaged from the base unit. In a preferred embodiment, the base unit is a resilient insulating material, such as plastic, and the cover unit is a shielding and heat sinking material, such as sheet metal.

13 Claims, 4 Drawing Sheets

TAMPER-PROOF BALLAST ENCLOSURE

BACKGROUND OF THE INVENTION

1. Field of the Invention

This invention relates to the field of high voltage equipment enclosures, and in particular to an enclosure for a ballast assembly in a lighting fixture.

2. Description of Related Art

To prevent accidental shock or electrocution, safety standards have been established that require certain electrical assemblies to be enveloped by an enclosure that prevents access to the electrical assembly. A ballast assembly that is used for providing a high voltage or high current signal to a lamp is a common example of an assembly that is required to be enclosed in a tamper-proof, or tamper-resistant, enclosure.

A variety of means have been employed in conventional ballast assemblies to prevent tampering. A sheet-metal enclosure is typically provided that has a base unit and a cover unit. In some assemblies, the cover unit and base unit contain flanges, and the cover unit's flange is bent around the base unit flange on two or four sides. In order to gain access to the interior of the formed enclosure, one must un-bend the corner cover flanges; typically, this requires the use of a pair of pliers. In other assemblies, tabs are provided in the cover, and matching slots are provided in the base. After placing the cover on the base, with the tabs extending through the base, the tabs are bent or twisted to affix the cover to the base. To remove the cover, the tabs must be un-bent or un-twisted, again typically requiring a pair of pliers. In each of these bent-metal sealing techniques, it is difficult to return the enclosure to its original condition after un-bending the cover to gain access. In other assemblies, screws or nuts and bolts are used to affix the cover to the base; this has the advantage of ease of access to the interior for repairs, and a subsequent restoration of the enclosure to its original condition, using a screwdriver.

Although each of the prior mentioned fastening methods prevent an accidental access to the interior of the enclosure, they do not prevent a purposeful access to the interior by a potentially unqualified individual who has access to a pair of pliers or a screwdriver. More permanent sealing techniques can be employed, such as crimping the flanges of the cover and base together, using screws with heads that only allow tightening, and so on, but these approaches also make it difficult or impossible for a qualified person to gain access to the electrical assembly for repairs.

The above mentioned sealing techniques are somewhat costly to implement in a manufacturing environment, because they require a metal-bending step, or the insertion and tightening of screws or bolts. Snap-together techniques are preferred in a manufacturing environment, and a number of techniques are commonly used for snapping plastic parts together. Generally, if the plastic parts are well affixed to prevent tampering, an attempt to disassemble the parts causes damage to the parts. Alternatively, special tools may be designed to allow the qualified person to disassemble the parts without damaging the parts. On the other hand, if the plastic parts allow for an ease of disassembly without causing damage, and without requiring a special tool, an unqualified person can gain access to the interior of the enclosure. U.S. Pat. No. 5,691,878, "Snap-Lockable Housing for Fluorescent Lamp Ballasts", dated Nov. 25, 1997, illustrates a conventional plastic ballast enclosure. In this referenced patent, a base unit has plastic tabs that snap into recesses of a plastic cover. Although these tabs may facilitate assembly, an unauthorized person can easily open the enclosure by pushing on the tabs, using, for example, a small screwdriver or paperclip.

BRIEF SUMMARY OF THE INVENTION

It is an object of this invention to provide an enclosure that facilitates an ease of manufacturing assembly, but encumbers an unauthorized disassembly of the enclosure. It is a further object of this invention to provide an enclosure that encumbers an unauthorized disassembly, but facilitates an authorized disassembly without the use of special tools. It is a further object of this invention to provide a method of enclosing an electrical assembly that facilitates an ease of manufacturing assembly, but encumbers an unauthorized disassembly of the enclosure.

These objects and others are achieved by providing an enclosure that has a cover unit that snaps into a base unit easily, but is difficult to remove from the base unit without knowledge of the appropriate disassembly technique. The appropriate disassembly technique includes the application of pressure at key regions on an exterior surface of the base assembly. The application of pressure at the key regions distorts the base assembly so as to disengage key portions of the cover unit from the base unit. The cover unit includes protrusions having an inclined surface (that is, inclined with respect to a direction of relative movement during assembly), and a flat engaging surface which is substantially transverse to the direction of relative movement. The inclined surface facilitates manufacturing assembly, and the engaging surfaces encumber the disassembly of the enclosure. The application of pressure at the key regions distorts the base unit so that the engaging surfaces of the cover unit are disengaged from the base unit. In a preferred embodiment, the base unit is a resilient insulating material, such as plastic, and the cover unit is a shielding and heat sinking material, such as sheet metal.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
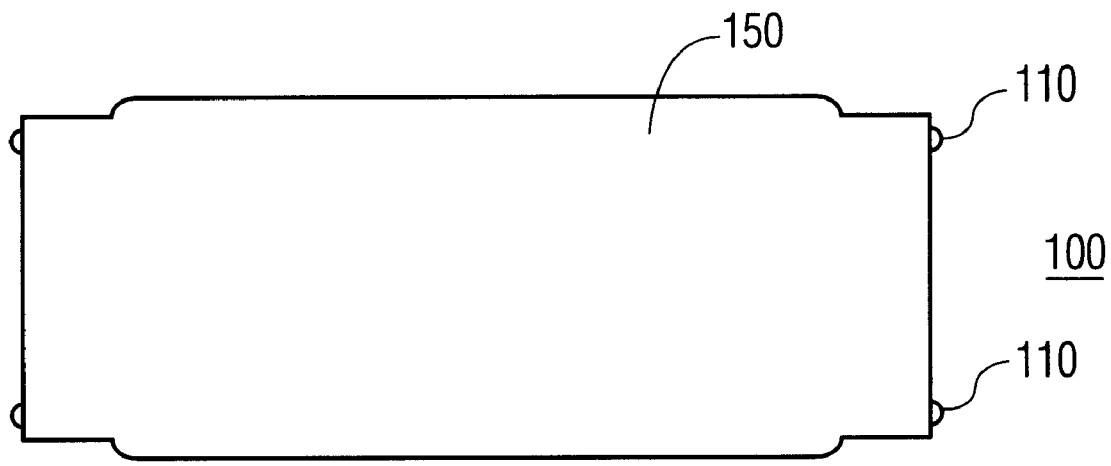
FIGS. 1–2 illustrate views of an example enclosure cover unit in accordance with this invention.
Figure 2:
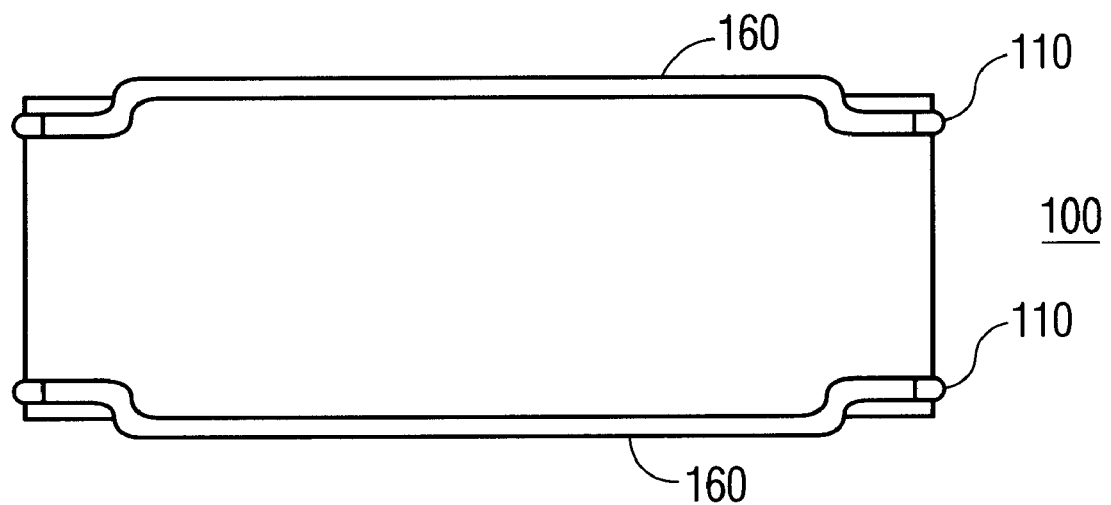
Figure 3:
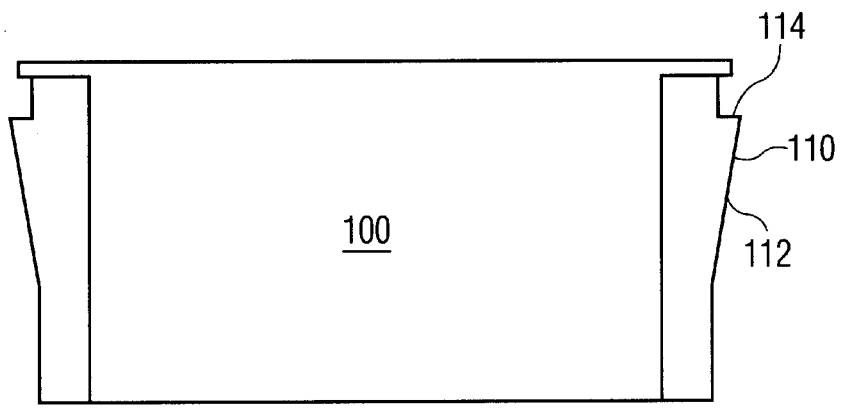
FIGS. 3–4 illustrate views of the example enclosure cover unit in relation to an example enclosure base unit in accordance with this invention.
Figure 3:
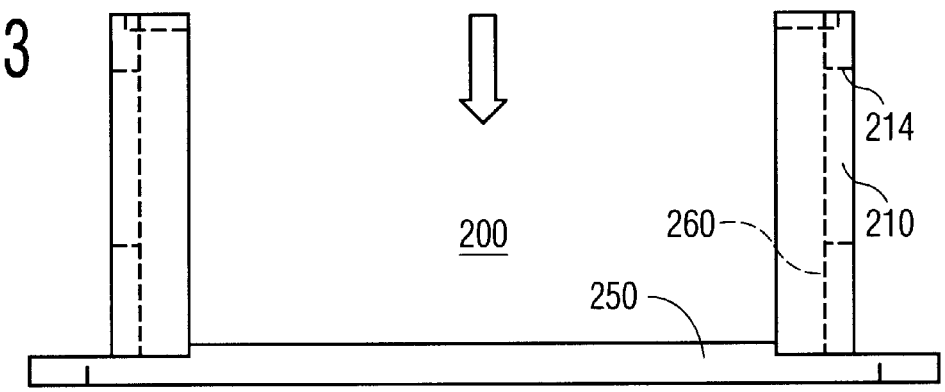
Figure 4:
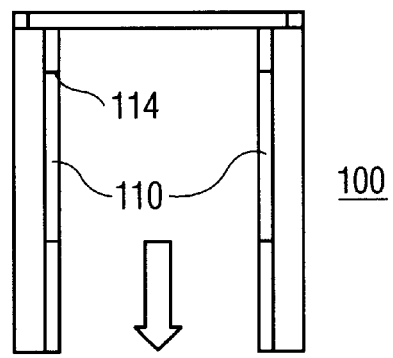
Figure 4:
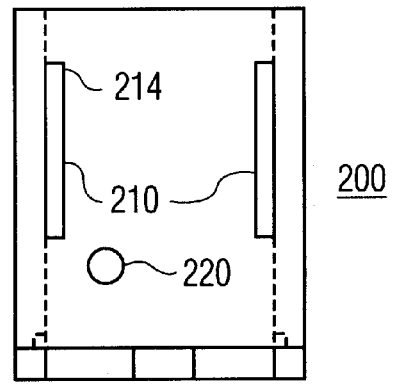
Figure 5:
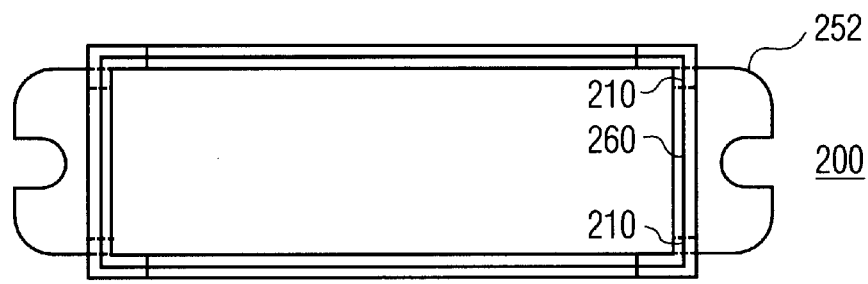
FIG. 5 illustrates another view of the enclosure base unit in accordance with this invention.

FIGS. 1–2 illustrate the top and bottom views, respectively, of an example enclosure cover unit 100; FIGS. 3–4 illustrate two side views of the example enclosure cover unit 100 in relation to an example enclosure base unit 200, and FIG. 5 illustrates a top view of the enclosure base unit 200.

The cover unit 100 has a closed top surface 150, two wall surfaces 160; the bottom and remaining two sides are open. In a preferred embodiment, the cover unit 100 is a formed and bent piece of sheet metal. Sheet metal provides EMI shielding by absorbing high frequency signals, and also provides efficient thermal radiation for attached devices that require heat sinks. In accordance with this invention, the cover unit 100 includes protrusions 110 that serve to facilitate the assembly of the enclosure, and to encumber its disassembly. Each protrusion 110 includes an inclined surface 112 that facilitates the assembly of the enclosure, and a flat surface 114 that encumber its disassembly.

The corresponding base unit 200 includes a closed bottom surface 250, two wall surfaces 260; the top and remaining two sides are open, and configured to receive the top 150 and wall surfaces 150 of the cover unit. The wall surface 260 includes receptacles 210 that are configured to receive the protrusions 110 of the cover unit. Each receptacle 210 includes an edge 214, which in conjunction with the corresponding flat 114 of each protrusion 110, encumbers the disassembly of the enclosure when the protrusion 110 is received in the receptacle 210, as illustrated by the cross section view of FIG. 6.

Upon assembly, the enclosure then has exterior surfaces formed by the respective exterior portions of the bottom surface 250, the two wall surfaces 260, the top surface 150 and the wall surfaces 160. The base unit protrusions 252, in line with the bottom surface 250, facilitate attachment of the enclosure to a fixture. It will be clear that such protrusions could alternatively be formed on the cover unit or on both units.

Figure 7:
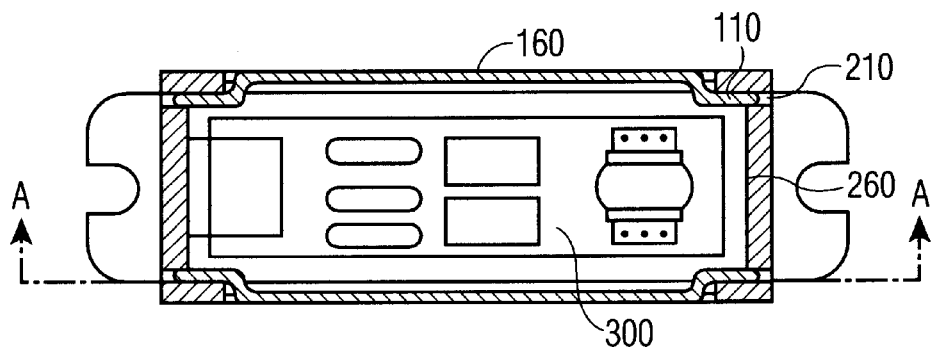

The cross section view of FIG. 7 illustrates how the walls 160, 260 are configured to form a surrounding enclosure. In a preferred embodiment, the lower surface 250 of the base unit 200 provides a supporting surface for an electronic assembly 300, such as a ballast assembly that includes a printed circuit board 310, a connector 320, components 330, a transformer 340, and the like.

As shown by an illustrative example in FIG. 4, the base unit 200 and/or the cover 100 contain one or more openings 220 that allow for wires or plugs to connect to the electrical assembly 300 within the interior of the enclosure via the connector 320. Preferably, the base unit is an insulating material, such as plastic, that insulates the assembly from the fixture to which that base unit is attached, and provides insulation around the connector 320, to prevent shorts from the power supply wires that connect to the assembly.

Figure 8:
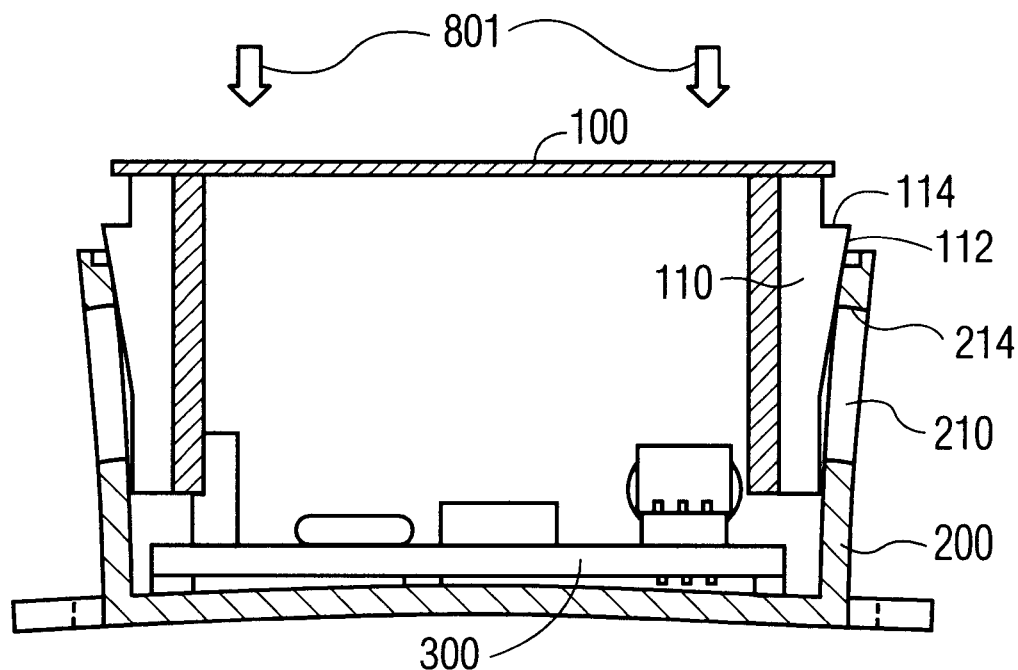
FIG. 8 illustrates the assembly of the example enclosure assembly in accordance with this invention.

FIG. 8 illustrates how the inclined surface 112 of the protrusion 110 of the cover 100 facilitates the manufacturing assembly of the enclosure. As the cover 100 is pressed in a direction of relative movement 801 into the base unit 200, the inclined surfaces 112 press against the inner surface of each wall 260 and distort the shape of the base unit 200. Preferably, the base unit 200 is a pliable and resilient material, such as a plastic, that allows the distortion, and then resumes its original shape. Continued pressure in the direction 801 on the cover brings the protrusion 110 into the region of the receptacle 210, at which time the base unit snaps over the end of the protrusion 110, due to the resiliency of the base unit 200. The return of the base unit 200 to its original shape secures the cover unit 200, via the correspondence of flat 114 and edge 214 in the cover 100 and base 200, respectively, as shown in FIG. 6.

Figure 6:
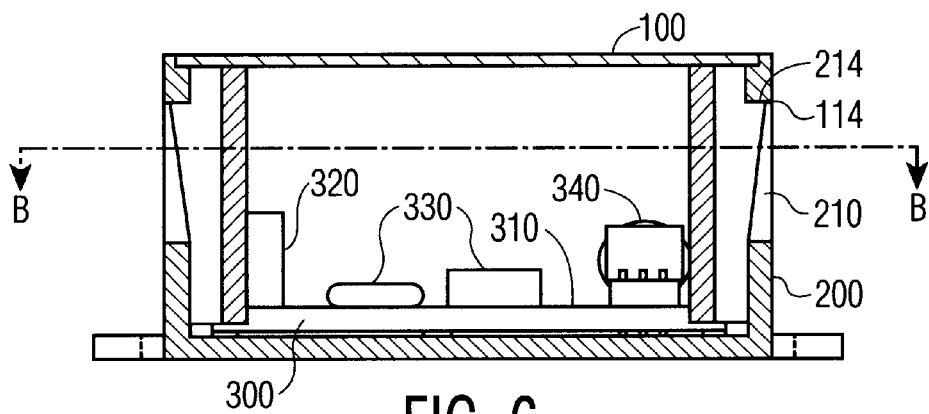
FIGS. 6–7 illustrate cross-section views of the example enclosure in accordance with this invention with the cover and base units attached.

Note that when the enclosure is assembled as shown in FIG. 6, a disassembly is difficult without an a priori knowledge of the internal mechanism used to bind the cover and base unit together. As compared to the prior art device of the above referenced U.S. Pat. No. 5,691,878, an application of pressure on the protrusion 110 is ineffective for disassembling the enclosure, because the protrusions extend from opposite ends of the cover walls and extend in the same width direction as these walls. That is, the protrusion 110 facilitates assembly, but does not facilitate disassembly.

Figure 9:
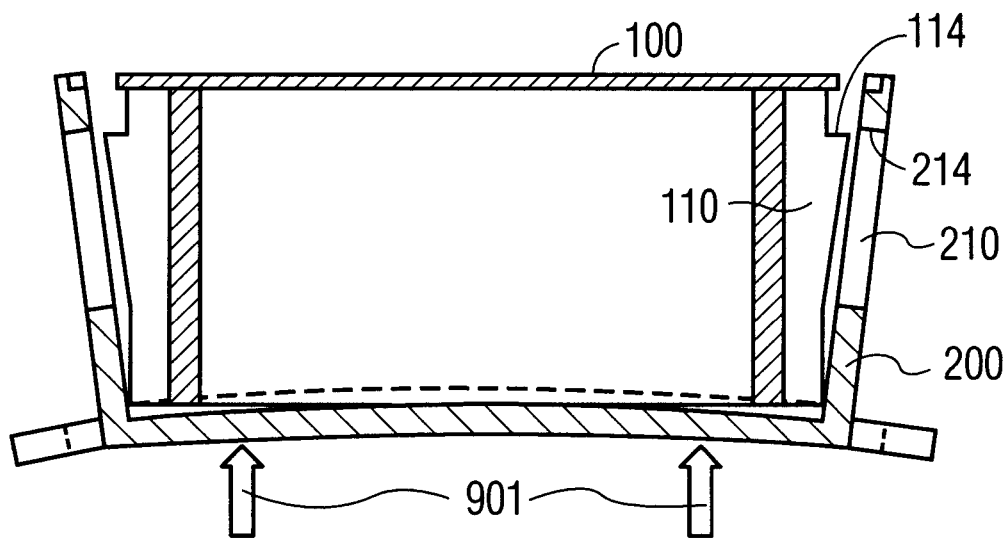
FIG. 9 illustrates the disassembly of the example enclosure assembly in accordance with this invention.

In accordance with this invention, an authorized person, such as a repairman, can be informed of an appropriate method of disassembly. FIG. 9 illustrates the disassembly of the example enclosure assembly in accordance with this invention. By applying pressure 901 at specified points on the base unit 200, the base unit 200 is distorted, as shown, so that the protrusions 110 of the cover unit 100 become disengaged from the receptacles 210 of the base unit 200. With knowledge of the appropriate disassembly technique, the enclosure is easy to disassemble; without this knowledge, the disassembly of the enclosure is difficult.

The foregoing merely illustrates the principles of the invention. It will thus be appreciated that those skilled in the art will be able to devise various arrangements which, although not explicitly described or shown herein, embody the principles of the invention and are thus within its spirit and scope. For example, a determination of the method used to secure the cover to the base can be further hidden from discovery by structuring the receptacles 210 of the base unit 200 to be open on the interior only. In this manner, a visual examination of the enclosure will not reveal clues as to the attachment means. Also, the example used in the figures is presented for illustration purposes only. Other configurations, such as an exchange of parts and functions between the base unit 200 and cover unit 100, a change in the location or number of protrusions 110 and receptacles 210, a change of shape of the protrusion and receptacles, and so on, are also feasible. These and other system configuration and optimization features will be evident to one of ordinary skill in the art in view of this disclosure, and are included within the scope of the following claims.

I claim:

1. An enclosure for an electrical assembly comprising:
a base unit, and
a cover unit, in an attached condition the base unit and the cover unit having respective exterior surfaces, the base unit and cover unit being assembled by relative movement in a direction of assembly,
wherein the cover unit comprises one or more outwardly extending protrusions that are configured to facilitate an attachment of the cover unit to the base unit, and to encumber a detachment of the cover unit from the base unit,
the base unit being U-shaped and having sidewalls and one or more receptacles in the sidewalls for the one or more protrusions to facilitate the attachment and encumber the detachment and permit the detachment by moving the sidewalls outwardly, and
at least one of the base unit and the cover unit are configured such that an application of force inwardly at one or more pressure points on the exterior surface of at least one of the base unit and the cover unit facilitates the detachment of the cover unit from the base unit.

2. The enclosure of claim 1, wherein the one or more protrusions of the cover unit:
extend beyond a nominal interior width of the base unit, and
include an inclined surface, which is inclined with respect to the direction of assembly, that facilitates a distortion of the base unit so as to enable the attachment of the cover unit to the base unit.

3. The enclosure of claim 2, wherein, the one or more receptacles of the base unit are configured to accept the one or more protrusions so as to eliminate the distortion of the base unit, and the base unit is sufficiently resilient so as to substantially return to an undistorted state when the one or more protrusions are accepted by the one or more receptacles, thereinafter requiring a distortion of the base unit to detach the cover unit from the base unit.

4. The enclosure of claim 3, wherein, the one or more protrusions of the cover unit comprise means for engaging respective edges of the receptacles to encumber the detachment of the cover unit from the base unit when the base unit is in the undistorted state.

5. The enclosure of claim 2, wherein the inclined surface terminates at an engaging surface which is substantially transverse to the direction of assembly, the engaging surface being aligned with an edge of a receptacle of the one or more receptacles when the base unit is attached to the cover unit, such that the alignment of the acute surface and the edge encumber the detachment of the cover unit and the base unit.

6. The enclosure of claim 1, further including one or more protrusions on at least one of the base unit and the cover unit that facilitate an attachment of the enclosure to a fixture.

7. The enclosure of claim 6, wherein:

the enclosure envelops a ballast, and the fixture is a lighting fixture.

8. The enclosure of claim 1, wherein at least one of the base unit and the cover unit include at least one opening that facilitates a connection of components within the enclosure to items exterior to the enclosure.

9. The enclosure of claim 1, wherein the cover unit includes a sheet metal material, and the base unit includes a plastic material.

10. The enclosure of claim 5, wherein:

the cover unit comprises a closed top surface and two walls, each of said walls extending in a width direction between two said protrusions, and said protrusions extend outwardly in said width direction.

11. The enclosure of claim 2, wherein:

the cover unit comprises a closed top surface and two walls, each of said walls extending in a width direction between two said protrusions, and said protrusions extend outwardly in said width direction from said walls.

12. A method of disassembly of a ballast enclosure comprising:

providing a plurality of outwardly extending protrusions on a cover unit of the ballast enclosure, said protrusions engaging respective receptacles in a base unit of the ballast enclosure so as to impede the removal of the cover unit from the base unit in the absence of the distortion to the base unit, applying force inwardly at one or more specific points on an exterior surface of said base unit of the ballast enclosure, thereby introducing a distortion to the base unit, and applying a detaching force to a cover unit of the ballast enclosure to remove the cover unit from the base unit.

13. The method of claim 12, wherein the base unit has a bottom portion and at least one wall, and said step of applying force consists of applying force inwardly to one or more specific points on the bottom portion of the base unit, and the distortion thereby introduced is an outward movement of a portion of at least one wall of the base unit.

\* \* \* \* \*